US009622323B2

(12) United States Patent
Hartman et al.

(10) Patent No.: US 9,622,323 B2
(45) Date of Patent: Apr. 11, 2017

(54) LUMINAIRE ASSOCIATE

(71) Applicant: GENERAL ELECTRIC COMPANY, Schenectady, NY (US)

(72) Inventors: Michael James Hartman, Clifton Park, NY (US); Bruce Gordon Barnett, Niskayuna, NY (US); John Erik Hershey, Ballston, NY (US); Michael Joseph Dell'Anno, Niskayuna, NY (US); Stanislava Soro, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/543,892

(22) Filed: Nov. 18, 2014

(65) Prior Publication Data
US 2016/0113092 A1 Apr. 21, 2016

Related U.S. Application Data

(60) Provisional application No. 61/907,090, filed on Nov. 21, 2013, provisional application No. 61/907,078, (Continued)

(51) Int. Cl.
*G08B 3/00* (2006.01)
*H05B 37/02* (2006.01)
(Continued)

(52) U.S. Cl.
CPC .......... *H05B 37/0227* (2013.01); *G01P 15/18* (2013.01); *G01R 22/06* (2013.01); *G01S 11/06* (2013.01); *G08B 21/18* (2013.01); *G08G 1/087* (2013.01); *H04W 4/046* (2013.01); *H05B 37/0263* (2013.01); *H05B 37/0272* (2013.01);
(Continued)

(58) Field of Classification Search
CPC . G01S 19/14; G07C 9/00158; H05B 37/0227; B05B 19/418
USPC .......... 340/12.5, 539.1, 870.07, 539.13, 669, 340/686.1, 689; 362/233; 315/312, 152, 315/294; 455/405, 445
See application file for complete search history.

(56) References Cited

U.S. PATENT DOCUMENTS 4,704,610 A 11/1987 Smith et al.
4,878,754 A 11/1989 Homma et al.
(Continued)

FOREIGN PATENT DOCUMENTS

EP 1437270 A1 7/2004
EP 2131630 A2 12/2009
(Continued)

OTHER PUBLICATIONS

International Search Report and Written Opinion issued in connection with corresponding PCT Application No. PCT/US2014/066927 dated Feb. 27, 2015.
(Continued)

*Primary Examiner* — Hoi Lau
(74) *Attorney, Agent, or Firm* — Pabitra K. Chakrabarti

(57) ABSTRACT

A street lighting fixture and street lamp used in street lighting containing an accelerometer that is used to detect and characterize acceleration events on a street lighting fixture. The accelerometer readings may be combined with GPS technology to determine a relocation of the street lighting fixture.

10 Claims, 12 Drawing Sheets

Related U.S. Application Data filed on Nov. 21, 2013, provisional application No. 61/907,069, filed on Nov. 21, 2013, provisional application No. 61/907,114, filed on Nov. 21, 2013, provisional application No. 61/907,133, filed on Nov. 21, 2013, provisional application No. 61/907,150, filed on Nov. 21, 2013, provisional application No. 61/907,168, filed on Nov. 21, 2013, provisional application No. 61/907,188, filed on Nov. 21, 2013, provisional application No. 61/907,210, filed on Nov. 21, 2013.

(51) Int. Cl.

| | | |
|---|---|---|
| *G01S 11/06* | (2006.01) | |
| *G08G 1/087* | (2006.01) | |
| *H04W 4/04* | (2009.01) | |
| *G01R 22/06* | (2006.01) | |
| *G01P 15/18* | (2013.01) | |
| *G08B 21/18* | (2006.01) | |
| *F21W 131/103* | (2006.01) | |
| *G01S 11/02* | (2010.01) | |
| *F21V 33/00* | (2006.01) | |
| *G01S 11/12* | (2006.01) | |

(52) U.S. Cl.
CPC ........ *F21V 33/00* (2013.01); *F21W 2131/103* (2013.01); *G01S 11/02* (2013.01); *G01S 11/12* (2013.01); *Y02B 20/72* (2013.01)

(56) References Cited

U.S. PATENT DOCUMENTS

| | | | |
|---|---|---|---|
| 5,014,052 A | 5/1991 | Obeck | |
| 5,028,129 A | 7/1991 | Smith | |
| 5,199,044 A | 3/1993 | Takeuchi et al. | |
| 5,243,185 A | 9/1993 | Blackwood | |
| 5,345,232 A | 9/1994 | Robertson | |
| 5,519,692 A | 5/1996 | Hershey et al. | |
| 5,519,725 A | 5/1996 | Hershey et al. | |
| 5,526,357 A | 6/1996 | Jandrell | |
| 5,557,261 A | 9/1996 | Barbour | |
| 5,563,728 A | 10/1996 | Allen et al. | |
| 5,563,906 A | 10/1996 | Hershey et al. | |
| 5,568,507 A | 10/1996 | Hershey et al. | |
| 5,568,508 A | 10/1996 | Hershey | |
| 5,568,509 A | 10/1996 | Hershey et al. | |
| 5,568,522 A | 10/1996 | Hershey et al. | |
| 5,682,100 A | 10/1997 | Rossi et al. | |
| 5,761,238 A | 6/1998 | Ross et al. | |
| 5,822,099 A | 10/1998 | Takamatsu | |
| 5,844,949 A | 12/1998 | Hershey et al. | |
| 5,852,243 A | 12/1998 | Chang et al. | |
| 5,903,594 A | 5/1999 | Saulnier et al. | |
| 6,011,508 A | 1/2000 | Perreault et al. | |
| 6,101,214 A | 8/2000 | Hershey et al. | |
| 6,122,084 A | 9/2000 | Britz et al. | |
| 6,288,632 B1 | 9/2001 | Hoctor et al. | |
| 6,308,134 B1* | 10/2001 | Croyle ................... G01C 21/16 340/990 |
| 6,346,875 B1 | 2/2002 | Puckette et al. | |
| 6,424,250 B1 | 7/2002 | Puckette, IV et al. | |
| 6,430,210 B1 | 8/2002 | McGrath et al. | |
| 6,433,976 B1 | 8/2002 | Phillips | |
| 6,459,998 B1 | 10/2002 | Hoffman | |
| 6,504,634 B1 | 1/2003 | Chan et al. | |
| 6,522,243 B1 | 2/2003 | Saulnier et al. | |
| 6,659,715 B2 | 12/2003 | Kuesters et al. | |
| 6,693,556 B1 | 2/2004 | Jones et al. | |
| 6,717,660 B1 | 4/2004 | Bernardo | |
| 6,943,668 B2 | 9/2005 | Gaus, Jr. et al. | |
| 7,175,082 B2 | 2/2007 | Hoshina | |
| 7,248,149 B2 | 7/2007 | Bachelder et al. | |
| 7,294,977 B1 | 11/2007 | Eusterbrock et al. | |
| 7,418,346 B2 | 8/2008 | Breed et al. | |
| 7,460,787 B2 | 12/2008 | Damink et al. | |
| 7,529,594 B2 | 5/2009 | Walters | |
| 7,580,705 B2 | 8/2009 | Kumar | |
| 7,629,899 B2 | 12/2009 | Breed | |
| 7,646,330 B2 | 1/2010 | Karr | |
| 7,817,063 B2 | 10/2010 | Hawkins et al. | |
| 7,834,555 B2 | 11/2010 | Cleland et al. | |
| 7,855,376 B2 | 12/2010 | Cantin et al. | |
| 7,876,864 B2 | 1/2011 | Conrad et al. | |
| 7,899,621 B2 | 3/2011 | Breed et al. | |
| 7,912,645 B2 | 3/2011 | Breed et al. | |
| 7,983,685 B2 | 7/2011 | Silverstrim et al. | |
| 7,983,836 B2 | 7/2011 | Breed | |
| 8,092,032 B2 | 1/2012 | Pearse | |
| 8,138,690 B2 | 3/2012 | Chemel et al. | |
| 8,140,276 B2 | 3/2012 | Walters et al. | |
| 8,227,995 B2 | 7/2012 | Damink et al. | |
| 8,232,745 B2 | 7/2012 | Chemel et al. | |
| 8,244,260 B2 | 8/2012 | Silverstrim et al. | |
| 8,260,537 B2 | 9/2012 | Breed | |
| 8,274,373 B2 | 9/2012 | Nysen | |
| 8,339,069 B2 | 12/2012 | Chemel et al. | |
| 8,368,321 B2 | 2/2013 | Chemel et al. | |
| 8,373,362 B2 | 2/2013 | Chemel et al. | |
| 8,384,312 B2 | 2/2013 | Tsai | |
| 8,436,748 B2 | 5/2013 | Mimeault et al. | |
| 8,441,214 B2 | 5/2013 | Anderson | |
| 8,442,403 B2 | 5/2013 | Weaver | |
| 8,442,785 B2 | 5/2013 | Walters et al. | |
| 8,456,325 B1 | 6/2013 | Sikora | |
| 8,475,002 B2 | 7/2013 | Maxik et al. | |
| 8,641,241 B2 | 2/2014 | Farmer | |
| 8,840,569 B2* | 9/2014 | Flaction ............. G06K 9/00342 340/573.1 |
| 8,842,009 B2 | 9/2014 | Jones | |
| 8,947,296 B2 | 2/2015 | Raz et al. | |
| 9,192,026 B2 | 11/2015 | Marquardt et al. | |
| 9,192,029 B2 | 11/2015 | Marquardt et al. | |
| 2002/0141882 A1 | 10/2002 | Ingistov et al. | |
| 2005/0017647 A1 | 1/2005 | Huang | |
| 2005/0047864 A1 | 3/2005 | Yamada et al. | |
| 2005/0104745 A1 | 5/2005 | Bachelder et al. | |
| 2005/0187701 A1 | 8/2005 | Baney | |
| 2007/0063875 A1 | 3/2007 | Hoffberg | |
| 2007/0085699 A1* | 4/2007 | Walters ................... G06Q 30/04 340/870.02 |
| 2007/0201540 A1 | 8/2007 | Berkman | |
| 2007/0222581 A1* | 9/2007 | Hawkins ............. G06Q 20/127 340/539.1 |
| 2007/0229250 A1 | 10/2007 | Recker et al. | |
| 2008/0037241 A1 | 2/2008 | Von Der Brelie | |
| 2008/0072766 A1 | 3/2008 | Kobylarz | |
| 2008/0122642 A1 | 5/2008 | Radtke et al. | |
| 2008/0150757 A1 | 6/2008 | Hutchison | |
| 2008/0238720 A1 | 10/2008 | Lee | |
| 2009/0002982 A1 | 1/2009 | Hu et al. | |
| 2009/0033504 A1* | 2/2009 | Tsai ........................ G08B 3/10 340/584 |
| 2009/0034258 A1 | 2/2009 | Tsai et al. | |
| 2009/0066540 A1 | 3/2009 | Marinakis et al. | |
| 2009/0120299 A1 | 5/2009 | Rahn et al. | |
| 2009/0128328 A1* | 5/2009 | Fan ........................ G08B 25/08 340/541 |
| 2009/0158739 A1 | 6/2009 | Messmer | |
| 2009/0164174 A1* | 6/2009 | Bears ...................... G01D 4/00 702/188 |
| 2009/0167508 A1* | 7/2009 | Fadell ..................... G06F 3/016 340/407.2 |
| 2009/0214198 A1 | 8/2009 | Takahashi et al. | |
| 2009/0268453 A1 | 10/2009 | Pearse | |
| 2009/0297156 A1 | 12/2009 | Nakagawa et al. | |
| 2010/0013608 A1* | 1/2010 | Petrisor ................... G01S 19/14 340/12.32 |
| 2010/0029268 A1* | 2/2010 | Myer ....................... F21S 2/00 455/426.1 |
| 2010/0115093 A1 | 5/2010 | Rice | |

(56) References Cited

U.S. PATENT DOCUMENTS

| | | |
|---|---|---|
| 2010/0295473 A1 | 11/2010 | Chemel et al. |
| 2010/0295474 A1 | 11/2010 | Chemel et al. |
| 2010/0295475 A1 | 11/2010 | Chemel et al. |
| 2010/0295482 A1 | 11/2010 | Chemel et al. |
| 2010/0295943 A1 | 11/2010 | Cha et al. |
| 2010/0296285 A1 | 11/2010 | Chemel et al. |
| 2010/0301768 A1 | 12/2010 | Chemel et al. |
| 2010/0301770 A1 | 12/2010 | Chemel et al. |
| 2010/0301771 A1 | 12/2010 | Chemel et al. |
| 2010/0301773 A1 | 12/2010 | Chemel et al. |
| 2010/0301774 A1 | 12/2010 | Chemel et al. |
| 2010/0301834 A1 | 12/2010 | Chemel et al. |
| 2010/0302779 A1 | 12/2010 | Chemel et al. |
| 2010/0308736 A1 | 12/2010 | Hung et al. |
| 2010/0309209 A1* | 12/2010 | Hodgins .............. G06T 13/40 345/473 |
| 2011/0001436 A1 | 1/2011 | Chemel et al. |
| 2011/0001438 A1 | 1/2011 | Chemel et al. |
| 2011/0001626 A1 | 1/2011 | Yip et al. |
| 2011/0043035 A1 | 2/2011 | Yamada et al. |
| 2011/0069960 A1 | 3/2011 | Knapp et al. |
| 2011/0095867 A1 | 4/2011 | Ahmad |
| 2011/0115384 A1 | 5/2011 | Chatelus |
| 2011/0140950 A1 | 6/2011 | Andersson |
| 2011/0156900 A1* | 6/2011 | Toda .................. H04N 5/772 340/539.13 |
| 2011/0215736 A1* | 9/2011 | Horbst .............. G05B 19/418 315/297 |
| 2011/0227584 A1 | 9/2011 | Beck |
| 2012/0053888 A1 | 3/2012 | Staehlin et al. |
| 2012/0062123 A1 | 3/2012 | Jarrell et al. |
| 2012/0086560 A1* | 4/2012 | Ilyes ................ H05B 37/0227 340/12.5 |
| 2012/0086561 A1* | 4/2012 | Ilyes ................ H05B 37/0227 340/12.32 |
| 2012/0126721 A1 | 5/2012 | Kuenzler et al. |
| 2012/0136485 A1 | 5/2012 | Weber et al. |
| 2012/0140748 A1 | 6/2012 | Carruthers |
| 2012/0154239 A1 | 6/2012 | Bar-Sade et al. |
| 2012/0163826 A1 | 6/2012 | Schenk et al. |
| 2012/0209505 A1 | 8/2012 | Breed et al. |
| 2012/0218101 A1 | 8/2012 | Ford |
| 2012/0230696 A1* | 9/2012 | Pederson .......... G07C 9/00158 398/115 |
| 2012/0245880 A1 | 9/2012 | Nabrotzky |
| 2012/0256777 A1 | 10/2012 | Smith et al. |
| 2012/0262304 A1 | 10/2012 | Cripps |
| 2012/0280825 A1* | 11/2012 | Sakakihara ............ G01C 21/08 340/686.1 |
| 2012/0286673 A1 | 11/2012 | Holland et al. |
| 2012/0299721 A1* | 11/2012 | Jones .................. B60R 25/33 340/521 |
| 2012/0299755 A1* | 11/2012 | Jones .................. G08B 13/1436 340/990 |
| 2012/0308239 A1 | 12/2012 | Sheth et al. |
| 2012/0309293 A1 | 12/2012 | Kummetz et al. |
| 2012/0321321 A1 | 12/2012 | Riesebosch |
| 2012/0323474 A1 | 12/2012 | Breed et al. |
| 2013/0044488 A1 | 2/2013 | Hreish |
| 2013/0057158 A1* | 3/2013 | Josefowicz .......... G01S 19/14 315/152 |
| 2013/0063281 A1 | 3/2013 | Malaska |
| 2013/0076523 A1* | 3/2013 | Kwan .................. A61B 5/0022 340/686.6 |
| 2013/0101003 A1 | 4/2013 | Vedantham et al. |
| 2013/0140995 A1 | 6/2013 | Jones |
| 2013/0144490 A1 | 6/2013 | Lord et al. |
| 2013/0169468 A1 | 7/2013 | Johnson et al. |
| 2013/0172012 A1 | 7/2013 | Zudrell-Koch |
| 2013/0181609 A1* | 7/2013 | Agrawal ................ H05B 37/03 315/131 |
| 2013/0181636 A1 | 7/2013 | Agrawal |
| 2013/0214697 A1 | 8/2013 | Archenhold |
| 2013/0221858 A1 | 8/2013 | Silberstein |
| 2013/0229116 A1 | 9/2013 | Van Zeijl et al. |
| 2013/0257284 A1 | 10/2013 | VanWagoner et al. |
| 2013/0293117 A1 | 11/2013 | Verfuerth |
| 2013/0330172 A1 | 12/2013 | Scipio et al. |
| 2013/0346229 A1* | 12/2013 | Martin .................. G06Q 40/00 705/26.3 |
| 2014/0055439 A1 | 2/2014 | Lee et al. |
| 2014/0085055 A1* | 3/2014 | Lee .................. G06Q 10/06 340/10.5 |
| 2014/0124007 A1 | 5/2014 | Scipio et al. |
| 2014/0125250 A1* | 5/2014 | Wilbur .................. H01Q 1/44 315/297 |
| 2014/0175982 A1 | 6/2014 | Yao et al. |
| 2014/0191858 A1* | 7/2014 | Morgan ............... G07C 5/0816 340/439 |
| 2015/0023668 A1 | 1/2015 | Spaulding et al. |
| 2015/0173159 A1* | 6/2015 | Lin .................. G01W 1/00 315/120 |
| 2015/0319825 A1* | 11/2015 | Destine ............. H05B 37/0227 315/153 |
| 2015/0339919 A1* | 11/2015 | Barnett ............... G08G 1/0116 340/907 |
| 2016/0094088 A1* | 3/2016 | Bjorn .................. H02J 9/061 315/161 |
| 2016/0095182 A1* | 3/2016 | Bjorn ................ H05B 37/0218 315/149 |
| 2016/0113092 A1* | 4/2016 | Hartman ............ H05B 37/0227 340/686.1 |

FOREIGN PATENT DOCUMENTS

| | | | |
|---|---|---|---|
| EP | 2521426 A1 | 11/2012 | |
| GB | 2403357 A | 12/2004 | |
| JP | 05205193 A | 8/1993 | |
| JP | 2005248607 A | 9/2005 | |
| JP | 2009025209 A | 2/2009 | |
| JP | 2009103497 A | 5/2009 | |
| KR | 1020060008967 A | 1/2006 | |
| KR | 1020060102552 A | 9/2006 | |
| KR | 100986279 B1 | 10/2010 | |
| WO | 2005029437 A2 | 3/2005 | |
| WO | 2009148466 A1 | 12/2009 | |
| WO | 2010079388 A1 | 7/2010 | |
| WO | 2011142516 A1 | 11/2011 | |
| WO | 2012090142 A2 | 7/2012 | |
| WO | 2012140152 A1 | 10/2012 | |
| WO | 2013160791 A2 | 10/2013 | |

OTHER PUBLICATIONS

Atlas, "Optical Extinction by Rainfall", Journal of Meteorology, Volume No. 10, pp. 486-488, Dec. 1953.

Noe et al., "Global Positioning System, A Navigation Algorithm for the Low-Cost GPS Receiver", The Institute of Navigation, Volume No. 1, pp. 166-172, 1980.

Proakis, "Spread Spectrum Signals for Digital Communication," in Digital Communications, for an overview of DS theory, pp. 1-27, 1983.

Hershey et al., "Random and Pseudorandom Sequences," Data Transportation and Protection, pp. 259-310, 1986.

"Millimeter Wave Propagation: Spectrum Management Implications" published by the FCC as Bulletin No. 70, Jul. 1997.

Pang et al., "LED Traffic Light as a Communications Device", Proceedings of the International Conference on Intelligent Transportation Systems, pp. 788-793, 1999.

Mimbela et al., "A Summary of Vehicle Detection and Surveillance Technologies Used in Intelligent Transportation Systems", Southwest Technology Development Institute, pp. 1-211, Nov. 30, 2000.

Bullimore, "Controlling Traffic With Radio", IEEE Review, Volume No. 47, Issue No. 1, pp. 40-44, Jan. 2001.

Chao-Qun et al., "Application of Low-voltage Power Line Communication in a City Street Lamp Long-distance Intelligent Monitoring System", Research and Developments, 2006.

Cho et al., "Street Lighting Control Based on LonWorks Power Line Communication", Power Line Communications and Its Applications, pp. 396-398, Apr. 2008.

(56) References Cited

OTHER PUBLICATIONS

Awan et al., "Characterization of Fog and Snow Attenuations for Free-Space Optical Propagation", Journal of Communications, Volume No. 4, Issue No. 8, pp. 533-545, Sep. 2009.
"Monitoring and Evaluation Protocol for the Field Performance of LED Street Lighting Technologies", Light Savers Accelerating Advanced Outdoor Lighting, Prepared by Toronto Atmospheric Fund in Partnership with Ontario Municipal Street Lighting Focus Group and Ontario Power Authority, pp. 1-32, 2011.
Qian et. al., "Based on PLC and GPRS, ZigBee street lamp wireless control system", Electronic Design Engineering, Volume No. 20, Issue No. 3, Feb. 2012.
Stevens et al., "White Paper—The Benefits of 60 GHz Unlicensed Wireless Communications" as captured by Wayback machine, SUB10 systems.com, pp. 1-10, May 7, 2012.
"Wireless Control and Communication System for LED Luminaires and Other Devices", San Francisco Public Utilities Commission Power Enterprise, pp. 1-15, Jun. 7, 2012.
Zotos et al., "Case study of a dimmable outdoor lighting system with intelligent management and remote control", Telecommunications and Multimedia (TEMU), 2012 International Conference on, pp. 43-48, Jul. 30-Aug. 1, 2012.
Caillet et al., "LonMark, the open Smart Streetlight Platform", Lonmark International, pp. 1-16, Feb. 2013.
After Newtown: A new use for a weapons-detecting radar?, University of Michigan, Apr. 1, 2013.
Lee et al., "Distributed dimming control for LED lighting", Optics Express, Volume No. 21, Issue No. S6, pp. 1-16, Nov. 2013.
International Search Report and Written Opinion issued in connection with related PCT Application No. PCT/US2014/066954 dated Feb. 26, 2015.
International Search Report and Written Opinion issued in connection with related PCT Application No. PCT/US2014/066922 dated Feb. 26, 2015.
International Search Report and Written Opinion issued in connection with related PCT Application No. PCT/US2014/066957 dated Mar. 5, 2015.
International Search Report and Written Opinion issued in connection with related PCT Application No. PCT/US2014/066917 dated Mar. 5, 2015.
International Search Report and Written Opinion issued in connection with corresponding PCT Application No. PCT/US2014/066337 dated Mar. 6, 2015.
International Search Report and Written Opinion issued in connection with related PCT Application No. PCT/US2014/066948 dated Mar. 9, 2015.
International Search Report and Written Opinion issued in connection with related PCT Application No. PCT/US2014/066942 dated Mar. 20, 2015.
Hartman et al., filed Nov. 18, 2014, U.S. Appl. No. 14/546,982.
Hartman et al., filed Nov. 18, 2014, U.S. Appl. No. 14/546,954.
Hartman et al., filed Nov. 18, 2014, U.S. Appl. No. 14/546,408.
Hartman et al., filed Sep. 12, 2014, U.S. Appl. No. 14/484,300.
Hartman et al., filed Nov. 18, 2014, U.S. Appl. No. 14/546,486.
Hartman et al., filed Nov. 18, 2014, U.S. Appl. No. 14/546,916.
Barnett et al., filed Nov. 18, 2014, U.S. Appl. No. 14/546,256.
Hartman et al., filed Nov. 18, 2014, U.S. Appl. No. 14/546,856.
Sarah Rich, Light Monitoring System Keeps Glendale Ariz. Out of the Dark, Government Technology, Oct. 24, 2011.
US Non-Final Office Action issued in connection with related U.S. Appl. No. 14/484,300 on Dec. 4, 2015.
Non-Final Office Action issued in connection with related U.S. Appl. No. 14/546,256 on Dec. 30, 2015.
US Non-Final Office Action issued in connection with related U.S. Appl. No. 14/546,982 on Feb. 1, 2016.
US Non-Final Office Action issued in connection with related U.S. Appl. No. 14/546,954 on Apr. 20, 2016.
US Non-Final Office Action issued in connection with related U.S. Appl. No. 14/546,916 on May 11, 2016.
Final Office Action issued in connection with related U.S. Appl. No. 14/546,256 on Jun. 2, 2016.

* cited by examiner roadway roadway

LUMINAIRE ASSOCIATE

This application is a non-provisional of and claims the benefit of U.S. Provisional Patent Application Ser. Nos. 61/907,069, 61/907,078, 61/907,090, 61/907,114, 61/907,133, 61/907,150, 61/907,168, 61/907,188 and 61/907,210 filed on Nov. 21, 2013, the entire contents of which are incorporated herein by reference.

BACKGROUND

Area and street lighting is one of the most important elements of a city's infrastructure. For such extensive lighting installations it is desirable to know the locations of individual luminaires for maintenance and other purposes involving planning and billing. In many instances, maintenance and installation crews installing luminaires record the luminaire locations by their GPS coordinates. The GPS coordinates are often provided by GPS receivers carried by the installation crews as part of a crew's personal data assistant. It occasionally happens that luminaires are moved and their new location coordinates are not recorded. This introduces bookkeeping errors and increases the city's overhead in maintaining the lighting infrastructure. It may also result in incorrectly locating and therefore misinterpreting data provided by non-illumination functions that are associated with, and physically proximate to, the luminaire.

It is also desirable for infrastructure managers to know if and when a luminaire has received a substantial physical shock so that the luminaire may be examined for damage and also to have a record of the time and characterization of the event for summarizing the facts of the incident causing the physical shock.

A need therefore exists for a luminaire associate that will report and record physical shocks and their characteristics and also alert infrastructure management to its relocation.

SUMMARY

A device, method, and system for a street lighting fixture to assess an acceleration event impacting the street lighting fixture and further to determine if there has been a relocation of the street lighting fixture.

BRIEF DESCRIPTION OF THE DRAWINGS

One or more exemplary embodiments are set forth in the following detailed description and the drawings, in which.

DETAILED DESCRIPTION

Figure 1:
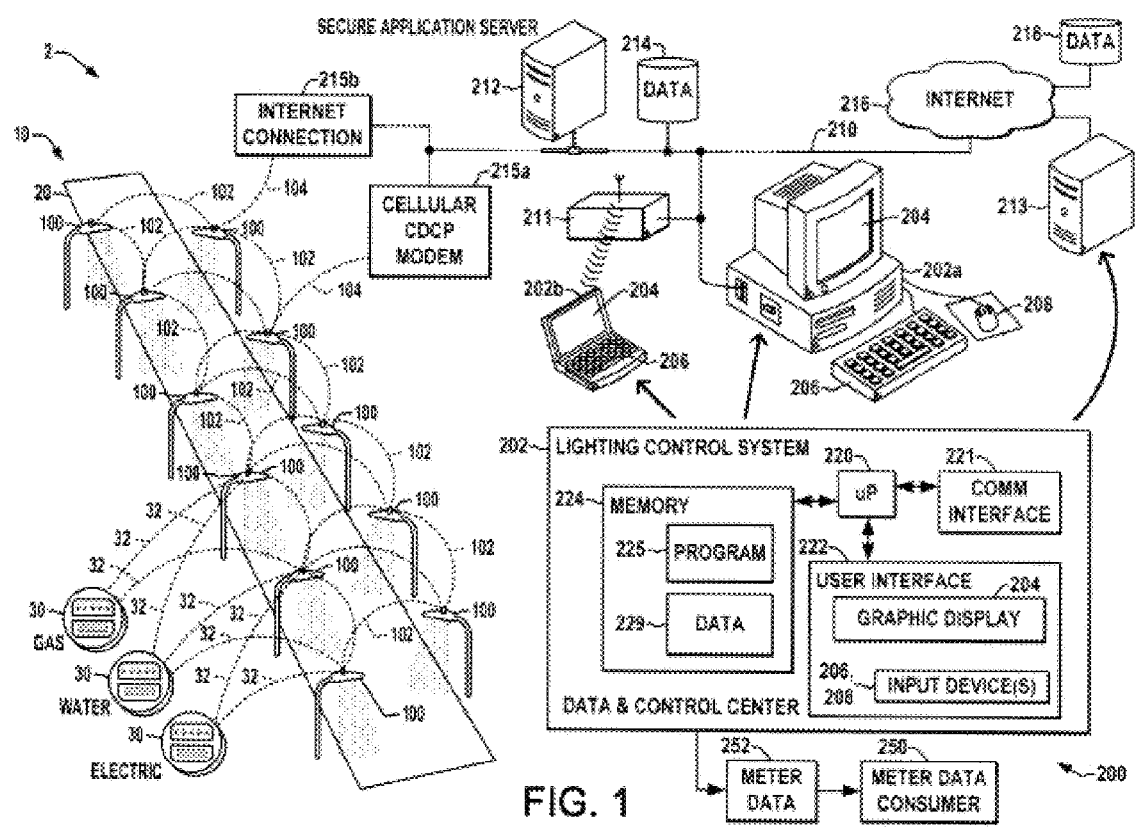
FIG. 1 is a system diagram illustrating an exemplary outdoor lighting system according to one embodiment.

Referring now to the drawings, like reference numerals are used in the figures to refer to like elements throughout, and the various features are not necessarily drawn to scale. The present disclosure relates to outdoor lighting systems and methods in which RF and/or PLC-enabled outdoor lighting fixtures form one or more networks for control and/or monitoring by a lighting control system of a general purpose network, with the control system able to obtain data from one or more utility meters by communications through a general purpose network and the lighting system network. The disclosed embodiments may be advantageously employed to facilitate utility meter reading without requiring manual reading of residential or commercial/industrial meters or localized wireless readings obtained from vehicles traversing local streets. Instead, utilities and other meter data consumers can obtain meter information via lighting control systems that control and/or monitor outdoor lighting fixtures via RF mesh networks and/or PLC-based local networks, with the lighting control system obtaining the meter data by communications through the general purpose network and the lighting system network. This usage of the outdoor lighting infrastructure as a conduit for utility meter information may thus save vast resources of utility companies in staffing manual meter reading operations and/or the expense of constructing and maintaining dedicated network infrastructures.

Figure 2:
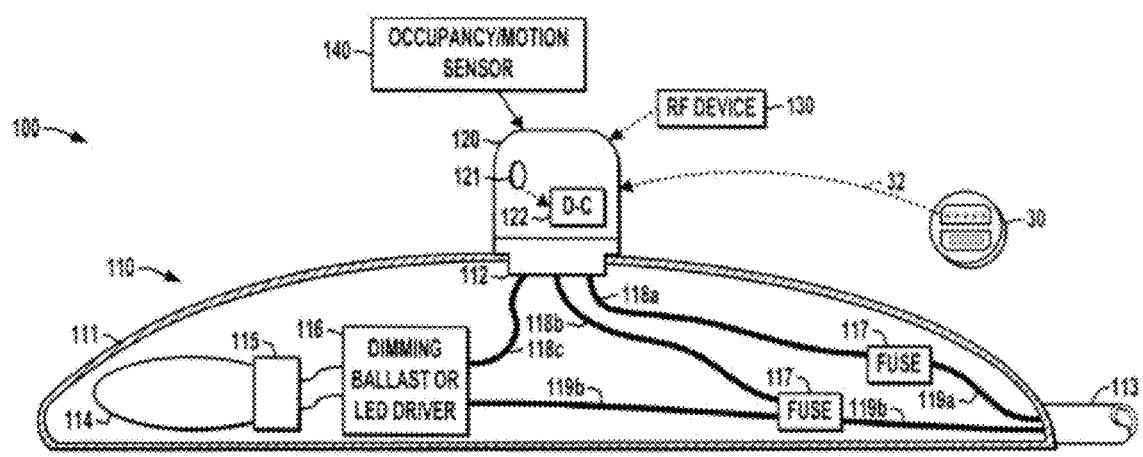
FIG. 2 is a partial sectional side elevation view illustrating an exemplary dimmable outdoor lighting fixture apparatus with a controller module according to one embodiment.
Figure 3:
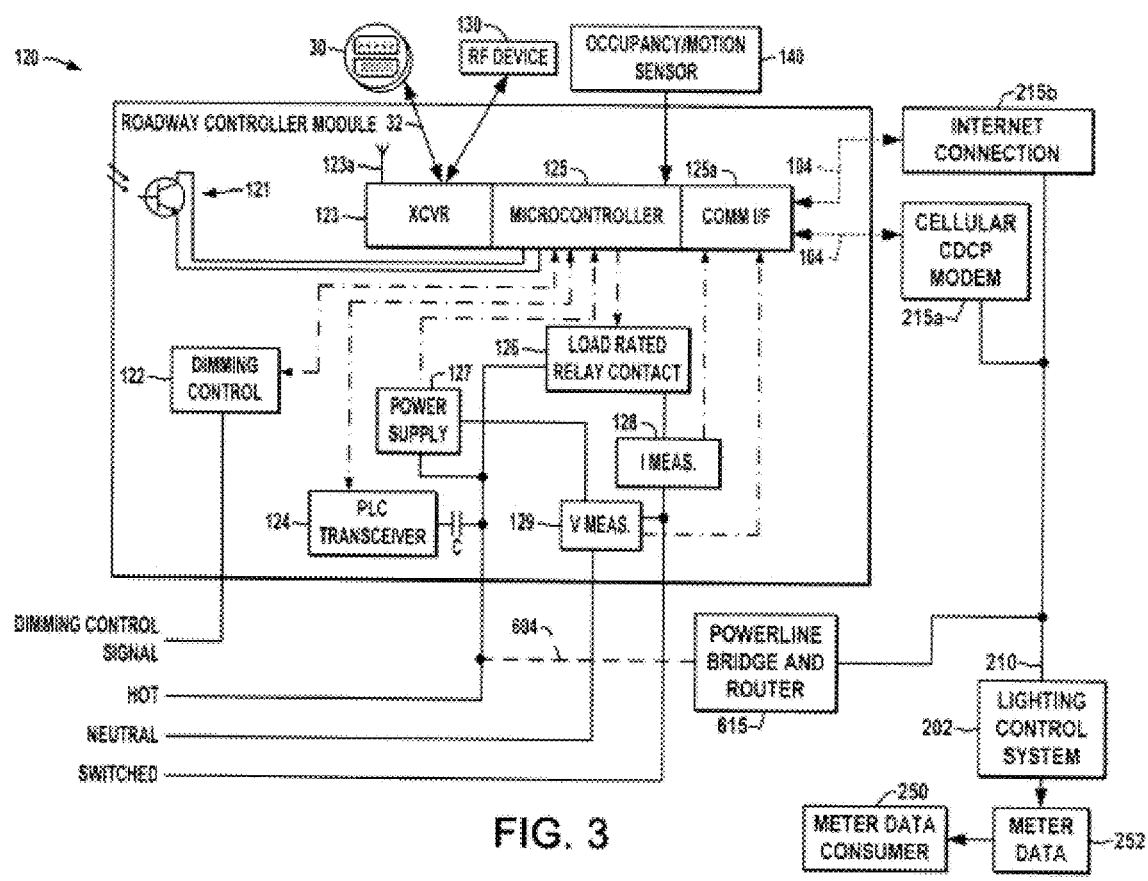
FIG. 3 is a schematic diagram illustrating further details of the controller module in the outdoor lighting fixture apparatus of FIG. 2.
Figure 4:
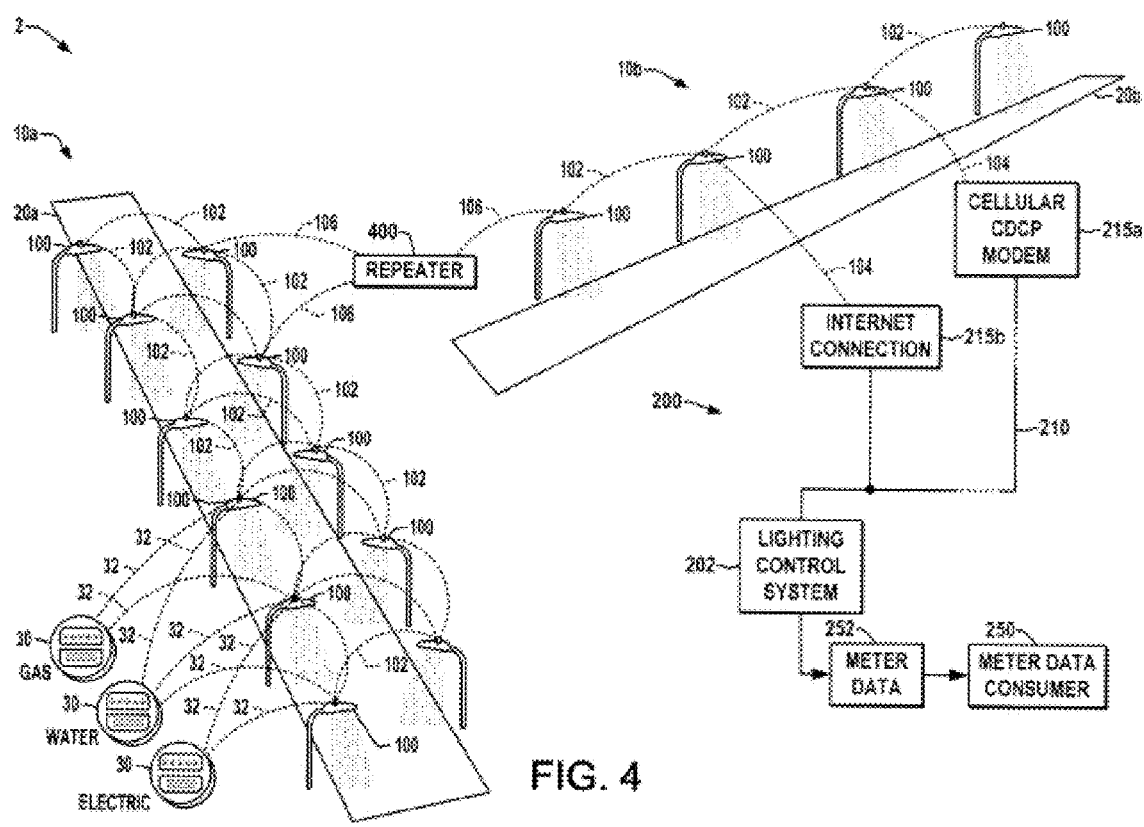
FIG. 4 is another system diagram showing an exemplary outdoor lighting system with multiple a mesh network portions interconnected by a repeater with one portion bridged to a general purpose network system according to one embodiment.

Referring initially to FIGS. 1-4, FIG. 1 depicts an exemplary outdoor lighting system 2 with RF-enabled outdoor lighting fixtures 100 forming an RF mesh network 10 for communication between some or all fixtures 100 proximate a roadway or street 20, where the mesh network 10 is formed via one or more individual RF communications connections or links 102 between fixtures 100 that are within range of one another. The links 102 may be continuous or discontinuous, with the network 10 being an ad-hoc self-healing network. The fixtures 100 in certain embodiments are individually addressable, such that each is capable of identifying a message and relaying received messages to other fixtures within the network 10, whereby two fixtures 100 can communication with one another through one or more intervening fixtures 100, even though they are not directly within RF range of each other. As shown in FIG. 4, moreover, the RF-enabled outdoor lighting fixtures 100 may establish RF mesh network connections 102 to form multiple mesh network portions with repeaters 400 bridging the portions. For example, FIG. 4 shows a first RF mesh network 10*a* and a second RF mesh network 10*b*, with a repeater 400 providing communications interfacing between the networks 10*a*, 10*b*. Moreover, one or more of the RF-enabled outdoor lighting fixtures 100 is operative to communicate by RF signaling with at least one RF-enabled utility meter 30, such as RF-enabled gas meters 30, water meters 30, electric power meters 30, for example.

The RF mesh network 10 is bridged with a lighting control system 202 of a general purpose network system 200 using any suitable bridging apparatus. In the examples of FIGS. 1-4, a bridging component 215 provides communications interfacing between the RF mesh network 10 and a general purpose network 210 of a network system 200. In certain embodiments, the bridging component is a modem, such as a pole-mounted Central Data Collection Point (CDCP) modem 215*a* operatively coupled to one of the fixtures 100 of the RF mesh network 10 to provide communications interfacing between the RF mesh network 10 and the general purpose network 210. In other embodiments, a pole-mounted Internet connection bridging component 215*b* provides an Internet connection to one of the RF-enabled outdoor lighting fixtures 100 of the RF mesh network 10 and interfaces communications between the networks 10 and 210.

The control system 202 is operative to obtain meter data 252 from one or more RF-enabled utility meters 30 by communications through the general purpose network 210 and the lighting system RF network 10. The control system 202 can then provide the meter data 252 to one or more meter data consumers 250, such as utility companies, municipalities, companies, etc. In operation, the lighting control system 202 is operatively coupled with the general purpose network 210 by any suitable network interconnections, direct and/or indirect, including wired and/or wireless interconnections for transferring signaling and/or messaging. The system 202 further operates to control or monitor at least one of the RF-enabled outdoor lighting fixtures 100, in addition to obtaining data from the RF-enabled utility meter(s) 30 via communications through the general purpose network 210, the bridging component 215, and the RF mesh network 10.

In certain embodiments, the RF mesh network 10 uses a ZigBee wireless protocol, although other suitable communications protocols can be used. Moreover, the fixtures 100 may be operative according to different protocols, for example, using a first protocol (e.g., ZigBee) to communicate with other fixtures in the mesh network 10, and may also employ a second protocol to communicate with utility meters 30. In certain embodiments, the lighting control system 202 can instruct one or more of the lighting fixtures 100 to switch to a second protocol for contacting one or more meters 30 to obtain readings or other data therefrom, after which the fixture 100 will revert to the first protocol to relay the obtained meter data 252 hack to the controller 202 via the RF mesh network 10, any intervening router(s) 400, the bridging component 215, and the general purpose network 210.

The wireless interface of the individual fixtures 100 may act as a router and retransmit received messages that are not destined for that particular fixture 100, thereby facilitating establishment and operation of the mesh network 10. Additionally, if a message is destined for the ballast control unit, the message may be relayed to the control module and the command therein used to control the dimmable ballasts and/or the light outputs. Other devices may be coupled with the mesh network 10 beyond the illustrated outdoor lighting fixtures 100, meters 30, repeaters 400, and bridging components 215, for example, external RF-enabled occupancy/motion sensors 140, external RF transmitters and/or receivers 130, and other like devices. For example, the mesh network 10 in certain embodiments may include a coordinator unit, such as a single coordinator per mesh network 10 (e.g., 1 for network portion 10*a* and another for portion 10*b* in FIG. 4). Upon initiating any network device, the fixture 100 registers with the coordinator unit using a unique id. In the case of the outdoor fixtures 100, registration may include messages notifying the coordinator unit of the capabilities of the fixture, for example, how many dimmable driver/ballasts 116 and light sources 114 and other fixture parameters, such as current dimming programs, profiles, or their control parameters, and/or diagnostic information.

The coordinator may coordinate the fixtures 100 with any other network devices and with one another. For example, the coordinator may send messages to the fixture 100 containing commands operative to control dimmable ballasts 116 and the light outputs thereof. The coordinator unit may act based upon internal stimuli, such as an internal clock or timer, or external stimuli, such as an event triggered by a network device or a user, for instance, based on commands received from the lighting control system 202. For example, a coordinator unit may instruct the fixture 100 to power on light outputs at a certain time or to power on light outputs in response to motion sensed by a motion sensor device 140. The coordinator may be a dedicated network device or can be integrated with another network device having additional functions. For example, a light fixture 100 or a bridging device 215, or a motion sensor 140 may act as the coordinator unit in addition to its above described functionality. Additionally, not every network device within the mesh network 10 need necessarily act as a router.

As shown in FIG. 1, the general purpose network system 200 may be a single or multiple network architecture providing a processing environment in which one or more aspects of the present disclosure may be practiced. The system 200 may include one or more processor-based lighting control systems 202 implemented in a networked computing environment. In the example of FIG. 1, a desktop computer 202*a* and a portable computer 202*b* are communicatively coupled with a network 210, each of which includes a graphical display 204 and one or more input devices, such as a keyboard 206, a mouse or other pointing device 208, microphones for speech commands, or other user input devices (not shown), where the portable computer 202*b* is coupled with the network 210 via a wireless transceiver 211. The network 210, in turn, may be communicatively connected with other networks, such as internet 216 providing operative access between the computers 202 and one or more of a network server 212, a network database 214, and/or an internet data store 218 and a further server 213. In this regard, one or both of the data stores 214, 218, and/or the servers 212, 213 or the computers 202 may store meter data 252 desired by a meter data consumer 250 to provide a unitary or distributed secure database, where such storage may also be used for lighting control data or other information related to outdoor lighting systems being operated and monitored by the lighting control system 202.

The presently disclosed systems and methods may be implemented in certain embodiments using one or more software program components operating or otherwise executed by a microprocessor or other processing element (e.g. microprocessor 220 in the processor-based system 202, microcontroller 125 in the lighting fixture control modules 120 as shown in FIG. 3, etc.). As best shown in FIG. 1, the processor-based lighting control system 202 can be implemented in whole or in part in a network server 212, in one or both of the computers 202, and/or in combination thereof. The control system 202 may include a microprocessor or other processing element 220, a communication interface 221 that operatively interconnects the processor-based system 202 with the network 210, as well as a memory 224, a graphical user interface 222 providing a graphic display 204 and one or more input devices such as the illustrated computer keyboard and/or mouse 206, 208. The memory 224 in this example may include data 229 and computer readable program code 225 with instructions executable by the processor 220 to implement the functionality described herein, where the system 202 may operate on a unitary data set, and/or the data may be implemented in distributed storage fashion with storage of portions in the processor-based system 202, the network server 212, and/or in one or more internet based data stores 213, 214, 218.

The system 202 may be operatively interconnected (e.g., via the network 210) with one or more bridging components 215, such as a wireless network via a Cellular CDPD modem or other wireless interface 215a or an internet connection 215b providing data exchange and other communication by and between one or more devices of the mesh network system 10 such as the light fixtures 100, and/or the meters 30 such that the processor-based lighting control system 202 receives data from and/or provides data to the devices 140, 100, 30. The processing element 220 in these embodiments may execute a program to implement a data and control center system to allow gathering of meter data 252 from one or more of the meters 30 that are communicatively coupled (continuously or intermittently) with the mesh network 10. A given meter 30 may be read using an RF connection between with one of the RF-enabled lighting fixtures 100 of the mesh network 10 as shown in FIG. 1 and/or using a powerline connection 604 (PLC-based) with one or more PLC-enabled fixtures 100 of an outdoor lighting network.

FIGS. 2 and 3 show further details of an exemplary outdoor lighting fixture apparatus 100 including a horizontal luminaire fixture assembly 110 with a fixture housing structure 111 having an inlet conduit 113 for receiving power wiring. The fixture housing 111 may be mounted to a building or to a pole or other support structure for a particular outdoor lighting application. One or more light sources 114 are supported in the fixture housing 111 via sockets 115, such as incandescent lamps, fluorescent lamps, high intensity discharge (HID) lamps, LEDs or arrays thereof, etc. The light source(s) 114 is driven by a ballast or driver 116, also supported in the housing 111. In certain embodiments a twist-lock receptacle 112 may be mounted to the top of the fixture housing 111 for connection of a controller module 120. The controller module 120 may include a photo sensor 121 operative to sense ambient light near the fixture assembly 110 for controlling turn on and turn off timing in certain embodiments. The twist-lock connector and the receptacle 112 provide electrical connection via wires 118a, 118b and 118c, with two input wires 119a and 119b routed into the housing 111 via the conduit 113, which may optionally be terminated at fuses 117. In one example, a first phase (line) wire 118a connects the power line from the first fuse 117 to a first receptacle terminal and a second phase wire 118b connects the power neutral to the second terminal, with the neutral also being connected from the second fuse 117 to the driver or ballast 116 via wire 119b. The power line is selectively switched by the controller module 120 and provided to the ballast or driver 116 via a switched line wire 118c, such that the ballast or driver 116 is selectively powered or unpowered by the operation of the controller 120 which may include a load rated relay contact 126 (FIG. 3) operative according to a switch control signal from the microcontroller 125 of the controller module 120 to selectively couple the incoming line connection 118a with the switched power line 118c. A dimming control signal may be introduced in certain embodiments from a dimming control/command component 122 to within the fixture housing 111 (FIG. 2) through a modification of the twist-lock socket 112, such as by including a fourth and/or fifth conductor to convey this signal to the dimming ballast or driver 116 within the housing 111.

FIG. 3 illustrates a controller module 120 that includes a dimming component (dimming command component) 122. The dimming component may be any suitable circuitry, hardware, processor-executed software or firmware, logic, etc., that operates to selectively provide dimming control values or signals to the ballast or driver 116 through the twist-lock receptacle 112 to cause the ballast or driver 116 to provide dimmable output from the light source(s) 114. The dimming component 122 is communicatively coupled to the microcontroller 125 that includes a transceiver 123 with an antenna 123a for RF communications according to one or more protocols with other RF devices 130 (e.g., external RF control devices), other RF-enabled fixtures 100, and/or with one or more RF-enabled utility meters 30. The microcontroller 125 also includes a communications interface 125a providing communications interfacing with an Internet connection bridging component 215b and/or with a CDPD modem bridging device 215a for ultimate connection with the lighting control system 202. In addition, the module 120 may include a Power Line Communication (PLC) transceiver 124 and a coupling capacitance C allowing the microcontroller 125 to communicate with other fixtures 100, meters 30, and/or a powerline bridge and router 615 via signaling connections 604 on one or both of the line power connections. Moreover, the module 120 may also include current and/or voltage measurement or sensing circuitry or components 128 and 129 for sensing input or switched power conditions for intelligent (e.g., feedback-type) dimming control.

The control module 120 in certain embodiments also includes a photo sensor 121 which senses ambient light proximate the fixture assembly 110 and provides a sensed light signal or value to the dimming component 122. The dimming component 122 selectively provides the dimming control value or values (e.g., 0-10V signal, messages, etc.) to the ballast or driver 116 in certain embodiments based at least in part on the sensed light signal or value. For example, the dimming component 122 may be programmed or otherwise configured to provide dimmed light via the dimming control value selection at dawn and/or dusk for reduced power consumption and for esthetic lighting, rather than the conventional full on/full off operation. In certain embodiments, moreover, the dimming component 122 may selectively dim the light output during certain times for energy conservation. For example, dimming unused roadways to a safe but efficient level in the middle of the night, with possible dimming control modification/override according to signals or values received from an occupancy/motion sensor 140 operatively coupled with the microcontroller 125. In certain embodiments, moreover, the dimming control component 122 may be implemented as one or more software components executed by the microcontroller 125.

In certain embodiments, the dimming component 122 is operative to selectively provide the dimming control value based at least in part on a received RF signal or value from an external RF device 130. For instance, an RF command signal can be sent to the controller module 120 wirelessly (and such signal can be sent to multiple controllers 120) for initiating dimmed, full on, full off, flashing operation, or combinations thereof by a control device 130 having an RF transmitter, thus allowing security personnel to control outdoor lighting operation. The dimming component 122 may thus provide the dimming control value(s) to control the light output according to one or more criteria, some of which may be externally actuated (e.g., via the PE sensor 121, motion sensor 140, and/or RF device 130 or combinations thereof) and some of which may be preprogrammed in the controller module 120.

Referring to FIGS. 2-5B, the system 2 may also include one or more occupancy/motion sensors 140 operatively coupled with one of the RF-enabled outdoor lighting fixtures 100 or otherwise coupled with the network 10. For instance, the controller module 120 may be operatively coupled with a motion sensor 140 (FIG. 2) to receive a wired or wireless signal (e.g., via transceiver and antenna1 123, 123*a*). The signal from the motion sensor 140 may indicate motion or person/vehicle occupancy near fixture 110. The dimming component 122 may be operated to selectively provide the dimming control value based at least in part on a sensed motion light signal or value from the motion sensor 140. For example, the dimming component 122 may increase a dimmed power level (or go to full-on operation from a previously dimmed setting) when motion is sensed and continue this modified operation for a predetermined time or until a separate reset command is received at the controller 120. In other embodiments, the dimming control signal can be varied for output light flashing operation based at least in part on a received motion detection signal from the sensor 140.

Figure 5A:
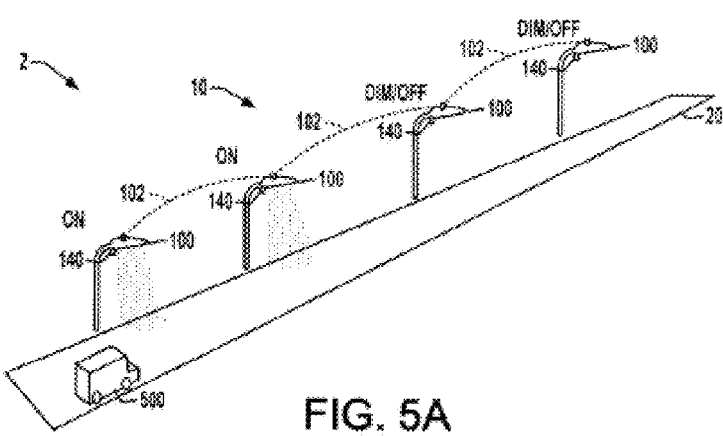
FIG. 5A is a partial system drawings illustrating use of motion/occupancy sensor(s) with reporting of sensed conditions between outdoor lighting fixtures via a lighting system network for intelligent lighting control according to one embodiment.
Figure 5B:
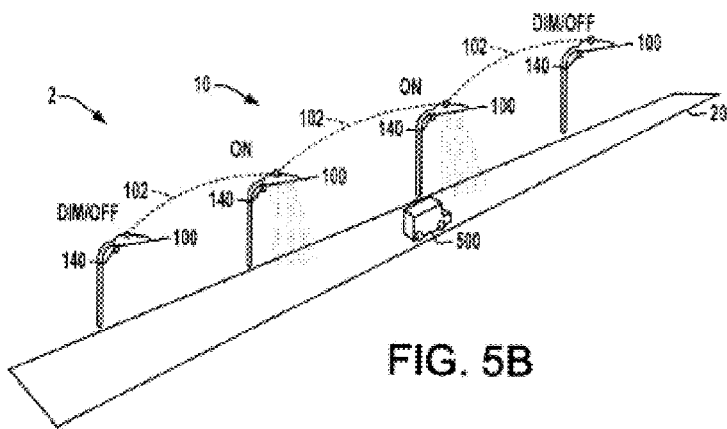
FIG. 5B is another partial system drawings illustrating use of motion/occupancy sensor(s) with reporting of sensed conditions between outdoor lighting fixtures via a lighting system network for intelligent lighting control according to one embodiment.

In the example of FIGS. 5A and 5B, the outdoor lighting fixtures 100 may notify one another of a sensed occupancy, motion signal or message received from the sensor 140 via the RF mesh network 10. A remotely controlled fixture 100 may respond by bringing the luminaire to full brightness despite a current dimming setting, which may be particularly advantageous in security and safety critical applications in that it does not depend in any way on the health or current connectivity of the control system 202. For example, a sensor 140 associated with a given fixture 100 (or associated with a portion of a roadway 20 proximate a given fixture 100) can alert the fixture that a vehicle is approaching during a period of time with low expected traffic in which a dimming control scheme or profile is currently used. The notified fixture 100 can alert other fixtures 100 along the roadway for controlled overriding of the dimming control (e.g., to briefly turn their light outputs up to full lighting) while the associated portions of the roadway are occupied. As shown in the example of FIG. 5A, when a vehicle 500 approaches (and is sensed by) a first of four fixtures 100, the first fixture goes from off/dimming operation to an ON condition and notifies the next fixture 100 to do the same, while subsequent fixtures 100 remain in the off/dimmed condition. As the vehicle 500 continues down the roadway 20, signaling from a subsequent sensor 140 is relayed/reported through the mesh network 10 to cause a third fixture 100 to turn ON, while the first fixture 100 returns to the dimmed/off operation. This system thus facilitates the conservation of electric power while providing timely lighting as needed by intelligent usage of the sensors 140 and sharing of the sensed condition information within the network 10. The sensed condition(s) may be relayed to the lighting control system 202 in certain embodiments. The lighting control system 202 may be interconnected with security systems and relay sensed occupancy/motion conditions for appropriate responsive or remedial action.

Figure 6:
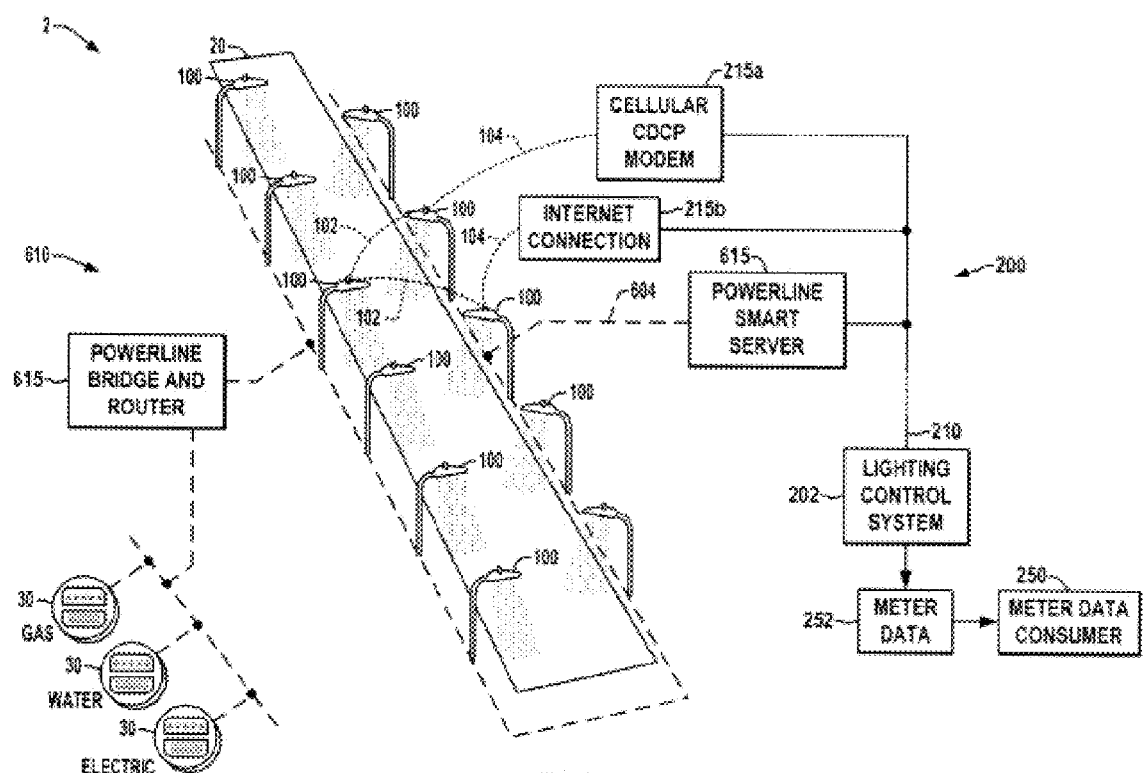
FIG. 6 is a system diagram illustrating an exemplary outdoor lighting system including Power Line Carrier (PLC)-enabled outdoor lighting fixtures according to one embodiment.

Referring also to FIG. 6, the outdoor lighting system 2 may also or alternatively include Power Line Communication (PLC)-enabled outdoor lighting fixtures 100 forming a Lighting system network 610 that is bridged with the lighting control system 202 of the general purpose network system 200. In this example, the lighting control system 202 obtains data from PLC-enabled utility meters 30 by communications through the general purpose network 210 and the lighting system network 610. The PLC-enabled outdoor lighting fixtures 100 are operative to communicate by power line signaling with at least one PLC-enabled utility meter 30 via the PLC outdoor lighting network 610, with one or more bridging components 215 and/or a powerline bridge and router 615 providing communications interfacing between the lighting network 610 and the general purpose network 210. The lighting control system 202 may operate as described above to control or monitor one or more of the PLC-enabled fixtures 100. The lighting control system 202 may also operate to obtain meter data 252 from the PLC-enabled utility meter(s) 30 by communications through the general purpose network 210, the bridging component 215, 615, and the PLC outdoor lighting network 610. The outdoor lighting network 610 in certain embodiments includes at least one RF communications connections 102 between at least two of the outdoor lighting fixtures 100 as described above, and the RF-based and PLC-based operations can be used separately or in combination in various embodiments.

In certain embodiments, a modem bridging component 215*a* is coupled with one or more PLC-enabled outdoor lighting fixture 100 to provide communications interfacing between the lighting network 610 and the general purpose network 210. In certain embodiments, an Internet bridging component 215*b* provides an Internet connection to the PLC-enabled fixture 100 to interface communications between the PLC network 610 and the general purpose network 210. In certain embodiments, the bridging component is a powerline bridge and router 615 that provides communications interfacing between the PLC outdoor lighting network 610 and the general purpose network 210. Multiple bridging components can be used in the various implementations, along with repeaters 400 (e.g., FIG. 4 above) to connect segments of a PLC/RF network 610, 10. Moreover, the PLC-enabled devices 100, 140, 615, etc. may provide multiple protocol support, for instance, with one protocol used for communicating with fixtures 100 and another used for communicating with utility meters 30. The above described occupancy sensor functionality and usage may be employed via one or more occupancy or motion sensors 140 (e.g., RF, directly connected, and/or PLC-enabled) which are operatively coupled with one of the PLC-enabled outdoor lighting fixtures 100. The lighting fixture 100 may operate to notify another fixture 100 of a sensed occupancy or motion signal or message received from the sensor 140 via the PLC outdoor lighting network 610.

Figure 7:
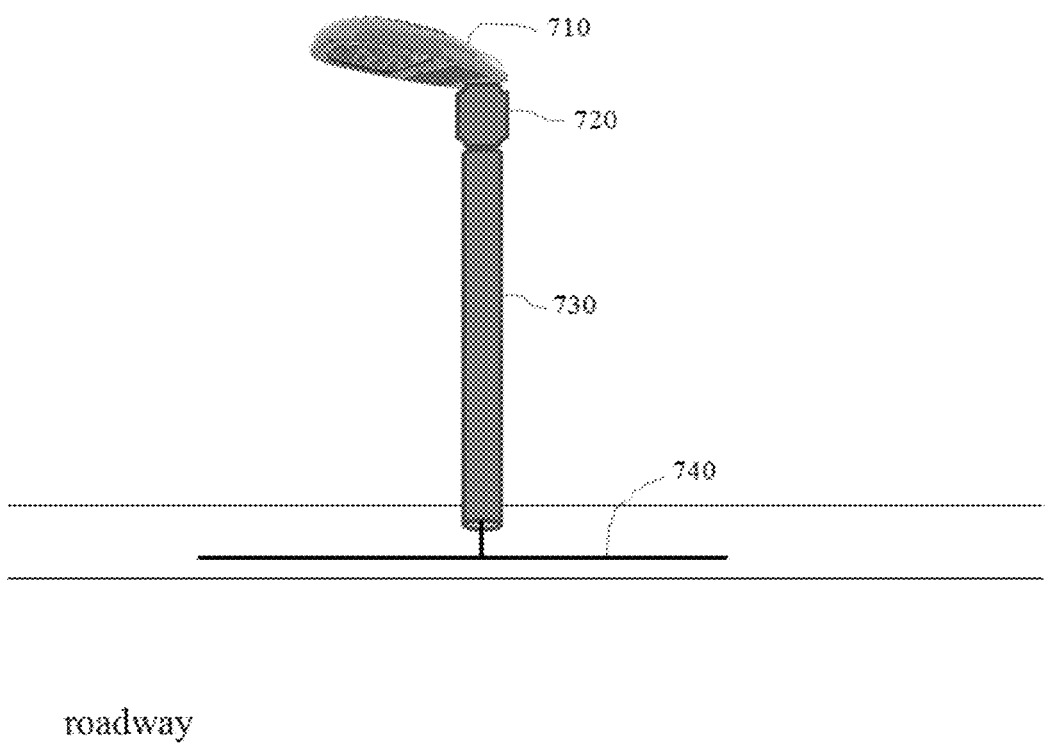
FIG. 7 is an illustration identifying the segments of a lighting fixture according to one embodiment.

In one particular, embodiment, the lighting fixtures 100 are described by segmentation into parts as illustrated in FIG. 7. The lighting fixture 100 comprises a lamp or luminaire 710, supported by a luminaire associate 720 that comprises the electronic components, electrical circuitry, and mechanical couplings associated with the mounting and control of the luminaire 710. The luminaire associate 720 is mounted atop a pole 730 that also provides a conduit for the powerline 740 serving the luminaire associate 720 and the luminaire 710.

Figure 8:
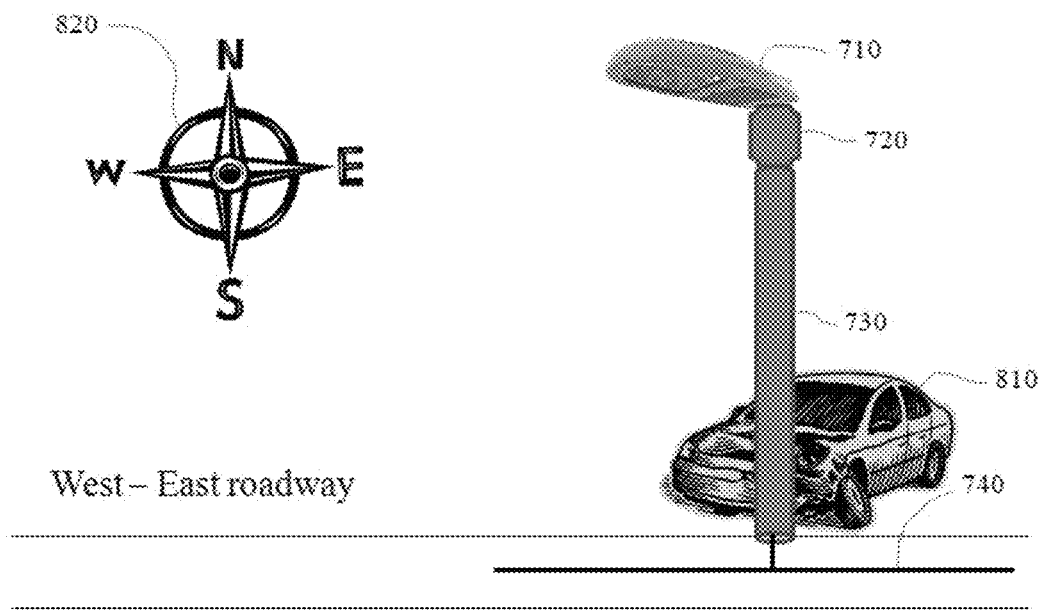
FIG. 8 is an illustration of a physical shock to a lighting fixture that caused an acceleration event according to one embodiment.

In this embodiment, the luminaire associate 720 will determine and record an acceleration event resulting from a physical shock to the luminaire associate 720. An acceleration event, as the term is used in this application, means acceleration induced by movement of the luminaire associate 720 incurred by the luminaire associate 720 experiencing a jerk or change in acceleration. Such acceleration events may include severe weather events such as earthquakes, airborne debris impacting the pole supporting the luminaire associate, projectiles, vandalism, explosions, or by a vehicle impacting the pole supporting the luminaire associate. FIG. 8 is an illustration of an errant vehicle 810 having run into pole 730 supporting luminaire associate 720. The reference compass point diagram 820 in FIG. 8 shows that the vehicle 810 was traveling in a southwestern direction when it impacted the pole 730. A two-axis accelerometer in the luminaire associate 720 are aligned such that the plane formed by the two axes is essentially parallel to the section of street below the luminaire associate. The two-axis accelerometer will sense that the jerk causing the shock to the luminaire associate 720 had a southwest direction.

Figure 9:
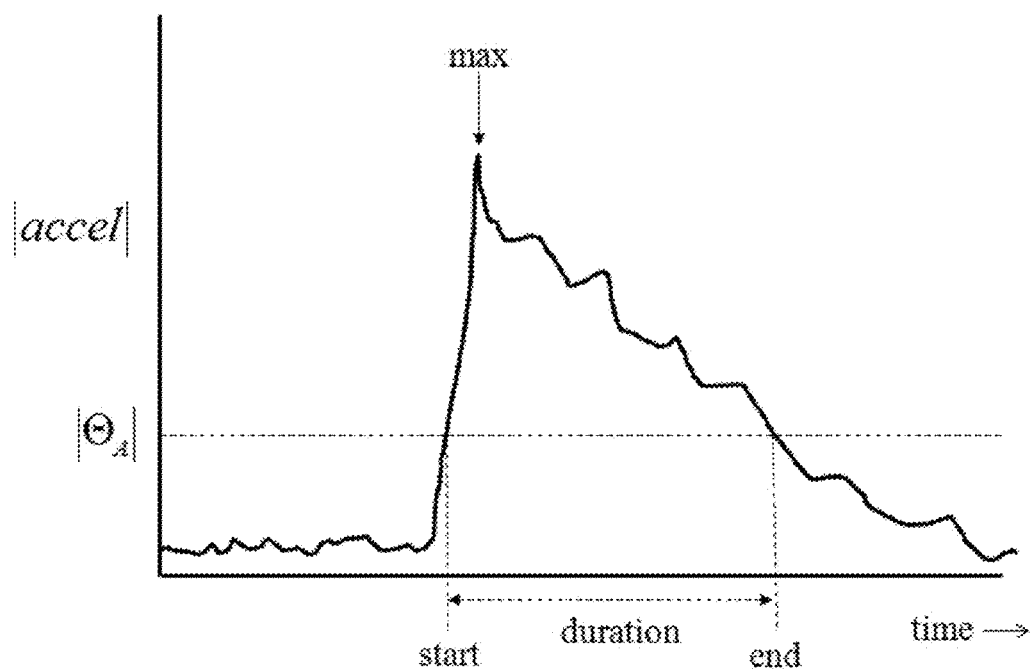
FIG. 9 is a graph representing the magnitude of horizontal acceleration plotted against time for an acceleration event according to one embodiment.

For example the illustration in FIG. 9 represents the magnitude of the horizontal acceleration as periodically sampled by a computer and plotted against time. The sampling is done of two analog-to-digital electronic converters of two axes of a multi-axis accelerometer where the two axes are orthogonal to each other and form a plane essentially parallel to the section of street below the luminaire associate device. For this example, the accelerations reported by the two axes are denoted as $A_N$ and $A_E$, respectively denoting the acceleration from the North direction and the acceleration from the East direction which in combination are referred herein as the horizontal acceleration. The magnitude of the horizontal acceleration is $|accel|=\sqrt{A_N^2+A_E^2}$. A preset threshold $|\Theta_A|$ is overlaid on the graph. If the magnitude of the horizontal acceleration exceeds the preset threshold, the start of an acceleration event is declared. When the horizontal acceleration drops below the preset threshold, the acceleration event is declared to be over. The direction angle of the jerk causing the acceleration event, $\hat{\theta}$, is estimated by computing $\hat{\theta}=\cos^{-1}A_N/A_E$ at the time, $t_{max}$, of maximum horizontal acceleration, $|accel|_{max}$.

Figure 10:
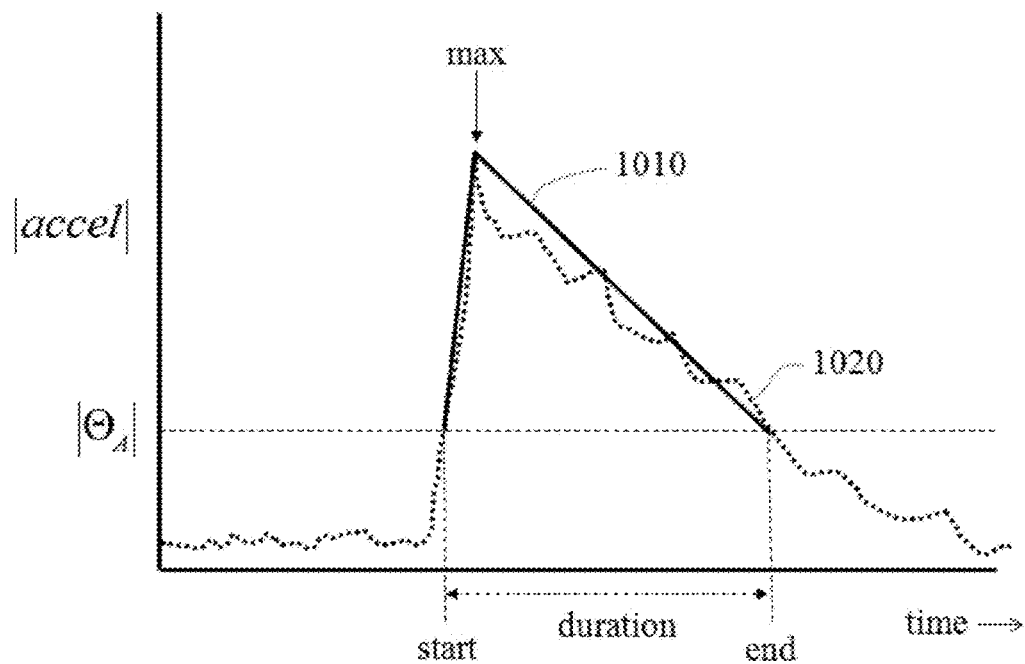
FIG. 10 is an illustration of a template fit to the magnitude of horizontal acceleration in the acceleration event depicted in FIG. 9.

The acceleration event may be summarized by detecting the beginning and ending of the acceleration event and then deriving a template that may be fitted to approximate the magnitude of the horizontal acceleration during the acceleration event. As an example, consider the illustration in FIG. 10. The $|accel|$ of FIG. 9 is plotted with a dashed line 1020 and the template includes of two joined solid line segments 1010. The leftmost of the two joined solid line segments begins at the two-dimensional point with coordinates (start, $|\Theta_A|$) and terminates at the two-dimensional point ($t_{max}$, $|accel|_{max}$). The rightmost of the two joined solid line segments begins at the two-dimensional point ($t_{max}$, $|accel|_{max}$) and terminates at the two-dimensional point (end, $|\Theta_A|$). The summary of the acceleration event is its start time, its end time, and the defining elements of the template used to approximate the magnitude of the horizontal acceleration during the acceleration event.

In another embodiment, the lighting fixtures 100 are also described by segmentation into parts as illustrated in FIG. 7, the luminaire associate 720 may determine if it has been relocated. In this embodiment, an observation may be made upon installation of the luminaire associates location. The location installed luminaire associate 720 may be recorded within a lighting system's database to be at a reference geographical position, and this datum is also stored in a non-volatile computer memory in the luminaire associate 720. There is concern that for many large street lighting infrastructures, luminaire associates could be relocated by installation and maintenance crews without updating their newly located positions in the lighting system's database. The luminaire associate device may be designed to detect its spatial translation beyond a distance preset by an installer or operator. If there is a significant temporal and distance displacement of the luminaire associate 720 from its stored reference geographical position, this would indicate a physical relocation of the luminaire associate 720. Such a physical relocation may be detectable by electronically sampling and processing the multi-axis accelerometer data by doubly integrating the measured accelerations to estimate the total displacement distance of the luminaire associate from its stored reference geographical position. The integration interval may be chosen according to exclude false indications of significant distance displacement due to the integration of error drift signals in the accelerometer data. Another detection method may periodically or aperiodically compare a calculated GPS position against the reference geographical position stored within the luminaire associate. A further method is to use techniques that are well known in the art to fuse accelerometer and other available sensor data with GPS readings and make a determination that the luminaire associate has likely been relocated.

Fusing GPS data with other sensor data may require an estimate of the accuracy of the GPS data provided. Many of the luminaire associates may be located in urban canyons and incapable of generally viewing a constellation of GPS satellites that will ensure low geometric dilution of precision. For these cases it may be best to employ a GPS receiver that reports some of the components of the geometric dilution of precision including the Horizontal Dilution of Precision (HDOP) so that the data fusion algorithm will be able to properly weight the GPS data.

As an example of data fusion of GPS and accelerometer derived estimate, consider the estimated horizontal displacement derived from the accelerometer data is $\vec{d}_a$ and the variance of the estimated horizontal displacement derived from the accelerometer data is $\sigma_a^2$. The estimated horizontal displacement derived from the GPS is $\vec{d}_g$ and that the variance of the horizontal measurement accuracy using the GPS is $\sigma_g^2$ before geometric dilution of precision. The horizontal geometric dilution of precision, HDOP, is $HDOP=\sqrt{\sigma_E^2+\sigma_N^2}$ where $\sigma_E^2$ and $\sigma_N^2$ are, respectively, the variances of the dilution of precision components in the orthogonal North and East directions. The variance of the horizontal measurement estimate of the GPS, $\sigma_G^2$, is thus $\sigma_G^2=HDOP^2 \cdot \sigma_g^2$. An estimate of the true displacement's variance, $\sigma_D^2$, may be derived by fusion through weighting the noise variances of the two estimators to produce $\sigma_D^2=1/(\sigma_a^{-2}+\sigma_G^{-2})$. The fusion estimate of the horizontal displacement is then $\vec{D}=\sigma_D^2(\sigma_a^2+\sigma_G^{-2}\vec{d}_g)$. This method of fusion would essentially discount the GPS estimate with respect to the accelerometer derived estimate if the GPS unit in the luminaire associate 720 were determined to have limited visibility to a GPS satellite constellation as may occur when the GPS unit is in an urban canyon.

Data fusion methods may also make use of data available from other sensors. Such other sensors may comprise inclinometers that measure angle of tilt and gyrometers (electronic gyroscopes) that measure angular velocity (rate of rotation). It is noted that electronic packages are commercially available that house a plurality of multi-axis sensors and host software to perform fusion upon the data from the plurality of housed sensors.

If an estimation determines that the luminaire associate has likely been relocated, then a datum indicating this may be set in non-volatile memory contained within the luminaire associate. For purposes of this application, the datum that indicates the likelihood that the luminaire associate has been relocated is referred to as the luminaire associate relocation datum or LARD.

Figure 11:
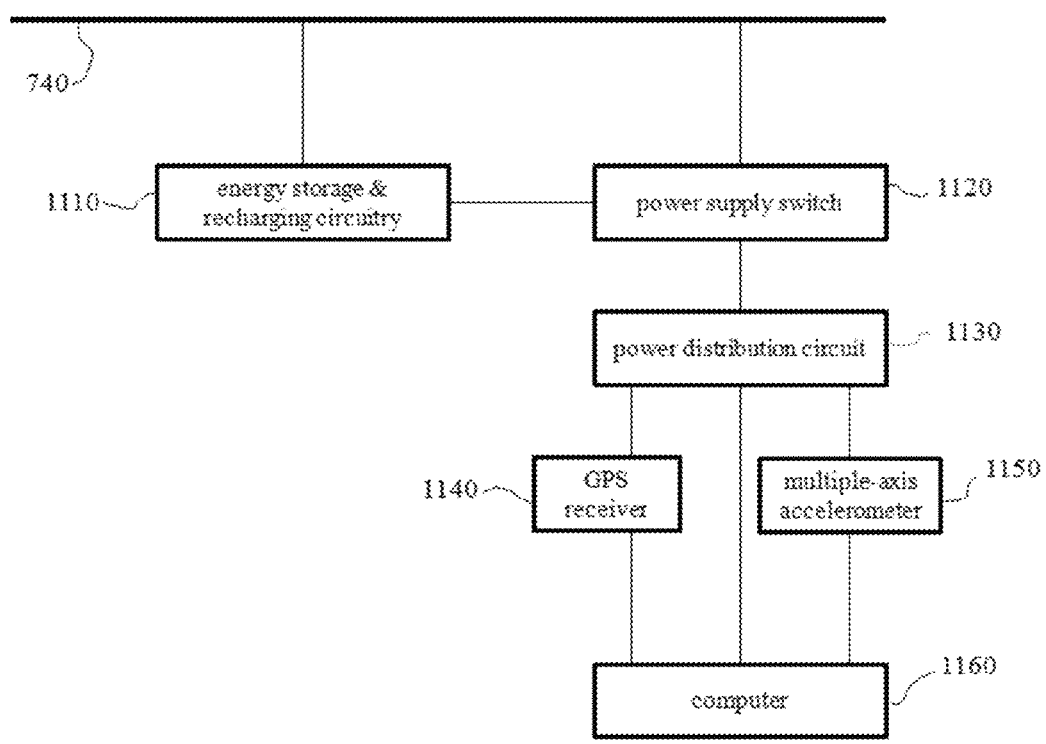
FIG. 11 illustrates the connection of components comprised in the luminaire associate according to one embodiment.

The luminaire associate 720 may comprise the components illustrated and connected as shown in FIG. 11. The luminaire associate powerline 740 is connected to a rechargeable energy storage device 1110 and its associated recharging circuitry 1110. The rechargeable energy device may be a rechargeable battery or ultracapacitor. A power supply switch 1120 is connected to both the luminaire associate powerline 740 and the rechargeable energy storage device 1110. The power supply switch 1120 may supply power to the power distribution circuit, 1130. The power supply switch 1120 may also inform the power distribution circuit, 1130, if the luminaire associate powerline 740 is energized. If the luminaire associate powerline 740 is energized, then the power distribution circuit 1130 may distribute power to a GPS receiver 1140, a multiple-axis accelerometer with electronic analog-to-digital converters 1150, and/or a computer 1160. If the luminaire associate powerline 740 is not energized, then the power distribution circuit 1130 does not distribute power to the GPS receiver 1140, the multiple-axis accelerometer with electronic analog-to-digital converter 1150, and/or the computer 1160 unless power is received from another source. In an embodiment, the power distribution circuit 1130, comprises a tilt switch or level monitor switch that can detect if the luminaire associate 720 is undergoing motion such as tilting or level changes which are likely to result from the luminaire associate's removal from its support pole 730 and its subsequent relocation. In this case, the power distribution circuit 1130 may supply power to the GPS receiver 1140, the multiple-axis accelerometer with electronic analog-to-digital converter 1150, and/or the computer 1160 for a duration preset by installation or maintenance personnel. The power distribution circuit 1130 may inform the computer 1160 that a tilt or level change has been detected that meets or exceeds preset amount and that it likely results from the luminaire associate's removal from its support pole 730. Subsequent data provided by the GPS receiver 1140 and the multiple-axes accelerometer may be fused, using sensor fusion techniques well known in the art, to provide an estimate of whether the luminaire associate 720 has been displaced beyond a distance preset by an installer or operator and the LARD is set.

Figure 12:
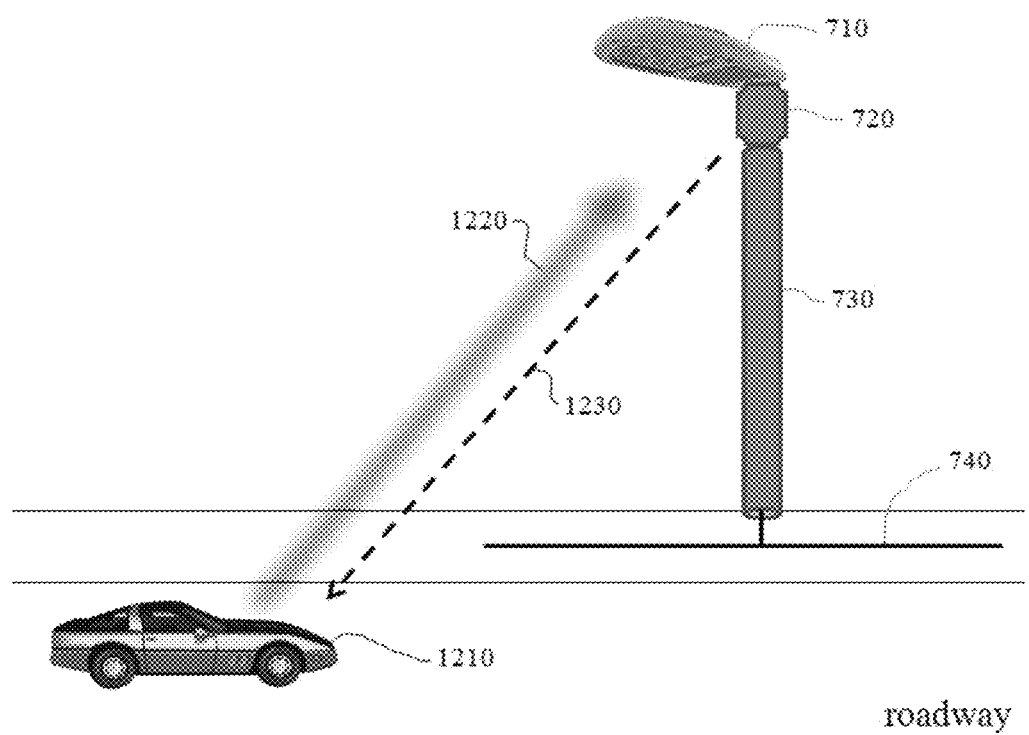
FIG. 12 illustrates a communications session between a luminaire associate and a maintenance crew according to one embodiment.

An embodiment is illustrated in FIG. 12 for detecting if the LARD is set. The luminaire associate 720 may turn on a low power wireless message transceiver and broadcast a signal 1230 indicating that the LARD is set. The low power wireless message transceiver may be fitted with an antenna whose pattern is oriented to radiate mainly towards the street below and immediately around the luminaire pole 730. As a maintenance crew in vehicle 1210 nears the pole 730, a monitoring receiver carried by the maintenance crew may be employed to detect the signal 1230 and respond to the luminaire associate 720 with signal 1220 informing the luminaire associate 720 of its new reference geographical location. The luminaire associate will then replace the its former reference geographical location with the new reference geographical location, reset the LARD, and cease broadcasting the signal 1230.

The above examples are merely illustrative of several possible embodiments of the various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been illustrated and/or described with respect to only one of several implementations, such feature may be combined with one or more other features of the other implementations as may be desired and advantageous for any given or particular application. Furthermore, references to singular components or items are intended, unless otherwise specified, to encompass two or more such components or items. Also, to the extent that the terms "including", "includes", "having", "has", "with", or variants thereof are used in the detailed description and/or in the claims, such terms are intended to be inclusive in a manner similar to the term "comprising". The invention has been described with reference to the preferred embodiments. Modifications and alterations will occur to others upon reading and understanding the preceding detailed description. It is intended that the invention be construed as including all such modifications and alterations.

The invention claimed is:

1. A luminaire associate device for use with a luminaire in a street lighting system comprising:
    a luminaire associate powerline that delivers power to the luminaire associate;
    an energy storage device having a recharging circuitry operatively connected to the luminaire associate powerline;
    a power supply switch connected to the luminaire associate powerline and the energy storage device;
    a power distribution circuit connected to the power supply switch comprising a tilt switch or level monitor switch;
    a GPS receiver powered by the power supply switch;
    a multiple-axis accelerometer with analog-to-digital electronic converters powered from the power supply switch; and
    a computer connected to the power supply switch, the GPS receiver, and the multiple-axis accelerometer.

2. The device of claim 1 further comprising at least one item in a group comprising an electronic gyroscope, a geomagnetic sensor, and an inclinometer.

3. The device of claim 1 wherein at least two of the axes of the multiple-axis accelerometer are aligned in the luminaire associate so that the plane formed by the at least two of the axes is essentially parallel to the section of street below the luminaire associate device.

4. The device of claim 1 further comprising a wireless message transceiver.

5. The device of claim 1 further comprising a powerline communication (PLC) transmitter.

6. The device of claim 5 where the PLC transmitter is a modified geometric harmonic modulation transmitter coupled to the luminaire powerline through a transient protection device.

7. A method for determining an acceleration event of a luminaire associate mounted on a street light having a power source, a lamp pole, the street light, a GPS receiver and the luminaire associate comprising the steps of:
   sensing movement of the luminaire associate through a multiple-axis accelerometer within the street light, wherein the multiple-axis accelerometer has two axes forming a plane essentially parallel to a ground plane upon which the street light sits;
   recording a time and a date for sensed movement if the sensed movement exceeds a predetermined threshold;
   calculating a magnitude of a horizontal acceleration from data reported by the sensing through the multiple-axis accelerometer;
   determining a start of the acceleration event as the time and the date the magnitude of the horizontal acceleration if the magnitude exceeds the preset threshold;
   determining an end of the acceleration event as the time and the date the magnitude of the horizontal acceleration drops below the preset threshold;
   recording the horizontal acceleration data reported by each of the multiple-axis accelerometer's two axes at the time of the maximum value of the magnitude of the horizontal acceleration during the sensed movement.

8. The method of claim 7 further comprising a step estimating the direction of the sensed movement to the luminaire associate by electronically calculating the angle of the sensed movement using the horizontal acceleration data recorded by each of the multiple-axis accelerometer's two axes at the time of the maximum value of the magnitude of the horizontal acceleration during the acceleration event.

9. The method of claim 8 further comprising a step of transmitting the maximum value of the magnitude of the horizontal acceleration during the sensed movement and the direction of the sensed movement received by the luminaire associate.

10. The method of claim 7 further comprising the steps of:
    fitting a template to approximate the magnitude of the horizontal acceleration during the sensed movement; and
    transmitting the defining elements of the template used to approximate the magnitude of the horizontal acceleration during the sensed movement.

* * * * *